United States Patent [19]

Yamazaki et al.

[11] 4,105,810
[45] Aug. 8, 1978

[54] CHEMICAL VAPOR DEPOSITION METHODS OF DEPOSITING ZINC BORO-SILICATED GLASSES

[75] Inventors: Takeo Yamazaki; Yoko Wakui, both of Hitachi; Tetuo Kosugi, Ibaraki, all of Japan

[73] Assignee: Hitachi, Ltd., Japan

[21] Appl. No.: 692,369

[22] Filed: Jun. 3, 1976

[30] Foreign Application Priority Data

Jun. 6, 1975 [JP] Japan ................................. 50/67559

[51] Int. Cl.$^2$ ............................................. C23C 11/08
[52] U.S. Cl. .................................. 427/248 C; 106/54; 118/48; 118/49; 357/73; 427/79; 427/80; 427/95; 427/99; 427/255
[58] Field of Search ............... 427/255, 248 C, 95, 427/99, 79, 80; 106/54; 357/73; 118/48, 49

[56] References Cited

U.S. PATENT DOCUMENTS

| 3,481,781 | 12/1969 | Kern ................................ 427/95 |
| 3,652,331 | 3/1972 | Yamazaki ...................... 427/248 B |
| 3,681,132 | 8/1972 | Pammer .......................... 427/248 C |
| 3,752,701 | 8/1973 | Morrisey ............................ 357/73 |
| 3,828,722 | 8/1974 | Reuter et al. ........................ 118/48 |
| 3,850,687 | 11/1974 | Kern ............................. 427/248 C |
| 3,900,330 | 8/1975 | Moriguchi et al. ................... 106/54 |

OTHER PUBLICATIONS

Powell et al., *Vapor Deposition*, pp. 401, 402 (1966).
Viva, *IBM Tech. Dis. Bull.*, vol. 14, No. 9, p. 2550 (Feb. 1972).
Kern et al., *J. Electrochem. Soc.*, vol. 117, No. 4, pp. 562-573 (1970).

*Primary Examiner*—Harry J. Gwinnell
*Attorney, Agent, or Firm*—Craig & Antonelli

[57] ABSTRACT

An alkyl compound of zinc is reacted with alkyl compounds or alkoxyl compounds of boron and silicon in the presence of oxygen, thereby to deposit on a substrate zinc borosilicate glass film through a chemical vapor deposition process. The outlet nozzle of a raw material supply conduit for introducing the raw material compounds into a reaction zone is opened in the direction substantially in parallel with a surface of the substrate on which the glass film is to be deposited so that raw materials may be well mixed at the reaction zone. The glass film thus produced has a uniform thickness and a homogeneous composition of the constituents over an area at least of 40 mm extending from the nozzle and is suited for use as protection films for semiconductor devices and dielectric layer for a thin film capacitor on an industrial base.

14 Claims, 13 Drawing Figures

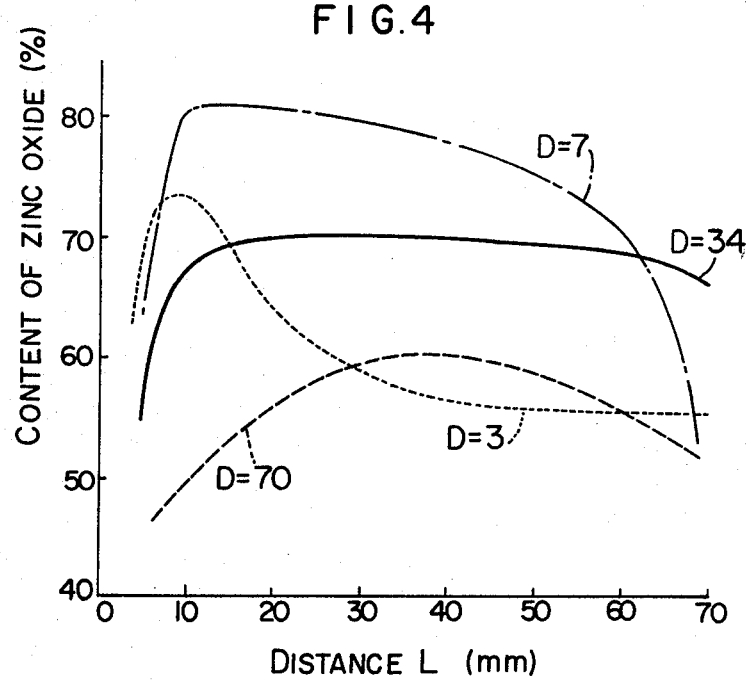
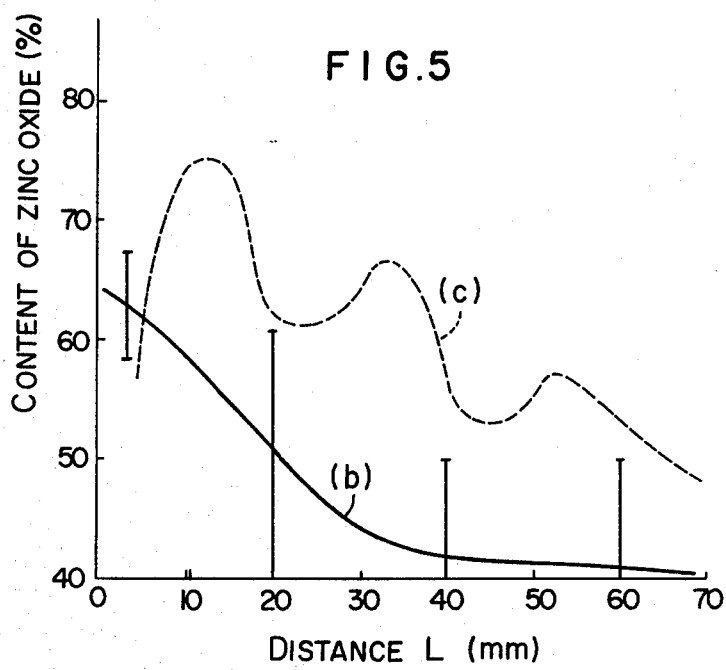

CHEMICAL VAPOR DEPOSITION METHODS OF DEPOSITING ZINC BORO-SILICATED GLASSES

BACKGROUND OF THE INVENTION

The present invention relates to a method of producing a chemical vapor deposition of zinc borosilicate glass which is suited for use as a surface protection film for semiconductor devices, insulation layers for integrated circuits and thin film capacitors.

As one of methods of protecting the surfaces of the semiconductor devices it is known to form a glass film. In the formation of such a glass film zinc borosilicate glass powders are deposited on the surface of the semiconductor device to be protected by a centrifugal sedimentation method, a slurry process or the like and subsequently subjected to a fusing treatment. Accordingly, the resulted glass film is usually relatively thick, and for this reason the use of the glass film is exclusively restricted to the application such as a surface protection film for diodes of a high breakdown voltage, stacked diodes or for the mesa portion of a semiconductor device of mesa-type or the like but it is difficult to use as the surface protection film for the integrated circuit devices or for the semiconductor device of planar type.

As attempt to make the thin glass film produced in the above described manner, it will be encountered many difficulties. For example, when the glass film is to be formed starting from the powder of the glass, roughness will be produced in the finished glass surface. Further, hollow spaces among the particles of the glass powders will tend to remain as voids in the formed glass layer. Under these conditions, the thickness of the glass film is so selected as to be greater than the diameter of such voids, which necessarily imposes limitation in the attempt to make the thinner glass film. When the glass film having a relatively large thickness is etched by using a photo-resist, it is impossible to attain a desired precision of the pattern formed by etching, which in turn renders the formation of a high density pattern impractical. Furthermore, since voids remain in the formed film, it is difficult to obtain a relatively thin film having a relatively large dielectric strength. A thick film evaded from such drawbacks provides also disadvantage that lead wires which are to be connected to electrodes of a device along the surface of such a thick glass film are easily broken at the edge portion of the glass film.

If such a thick glass film of a conventional type as described above is used for an integrated circuit when it is desired to perform a high integration density, unavoidable etching error due to a large thickness of the film will necessarily involve a reduced precision in the produced pattern of the circuit configuration.

With a view of making the film thinner, thereby to enhance the integration density, it is known to use a silicon oxide film as the protection film. However, a single layer of such protection film is insufficient for attaining a wanted moisture resistance as well as dielectric strength. As an attempt to increase the dielectric strength and at the same time decrease the surface charge storage, it is also known to form a phosphorous glass coating over the silicon oxide layer. When the precision of pattern formed by etching in the device using the phosphorous glass is to be improved, content of phosphorus in the glass material has to be increased. However, high content of phosphorus component in the glass composition will disadvantageously result in a decreased moisture resistance. Consequently, the single layer protection film of the conventional type can not assure an adequate protection function.

It has been also proposed a method of producing a protection glass film according to which vapor produced by evaporating a halogen compound of metals is fed into a reaction chamber by means of a carrier gas thereby to deposit the metal elements on the surface of a heated substrate disposed in the reaction chamber in a form of a pure metal deposition or in a partially oxidized deposition, which is subsequently subjected to a heating process in the presence of an oxidizing atmosphere. According to another known method, vapor produced by evaporating the above-mentioned compound is successively fed to the reaction chamber together with oxidizing gas thereby to form deposition of oxides of evaporated metals on the substrate surface in a form of a multi-layer structure, which is thereafter fused together under the heating to form a glass film.

However, in the case of the first method in which the deposited metals or imperfect oxides thereof undergo subsequently oxidation treatment, it is difficult to make all the deposits glassy or to be vitrified, as a result of which a difference in thermal expansion may occur between the surface and the inner regions of the glass film to give rise to delamination in the vicinity of the interface between the film layer and the substrate, or otherwise nonhomogeneous formation of the film having non-uniform distribution of composition in the transversal direction of the film. On the other hand, in the case of method in which the successively formed multi-layer of metal oxides is subsequently heated to be fused together, a high temperature is required for vitrification, not to speak of adverse effects of the difference in the thermal expansion coefficients among the various metal oxide layers. Accordingly, this method can not be applied to certain types object.

Method of depositing a glass of a three-component series on a semiconductor device through a chemical vapor deposition process is disclosed in U.S. Pat. No. 3,481,781 to W. Kern. The attempt to form a homogeneous thin glass film through the chemical vapor deposition process has been encountered with various problems to be solved. For examples, difficulties lie in controlling the glass composition at predetermined values, increasing adhesiveness between the glass film and a substrate, enhancing the growing rate of deposited glass, assuring a safety in the working environment, forming the film of a predetermined uniform thickness over a wide area, etc.

The inventors of the present application have found that the above described various problems can be substantially solved by selecting predetermined types of starting materials, using them in selected combination and correspondingly modifying the nozzle structures of conduits used for supplying the raw materials. For example, when diborane ($B_2H_6$) and silane ($SiH_4$) are employed as raw materials to form a glass of combined boron oxide and silicon oxide, the vitrification reaction will be accompanied with undesirable auxiliary reactions which affect adversely the formation of the wanted homogeneous glass, not to speak of the troublesome handling of diborane due to the deadly poisonousness thereof. The occurrence of such secondary reactions depends on the presence or absence of other components and in turn affects the reaction temperature as well as the chemical vapor growth rate of glass. In order to suppress the secondary reactions at minimum and at the same time permitting a homogeneous vitrification reaction to occur over a wide area, it is necessary to use injection nozzles of specifically devised structures for the conduits to supply the raw material gases. The term "reaction temperature" as herein used means a temperature of a substrate on which the chemical vapor deposition can take place.

The composition and components of the glass for vitrification of the surface of silicon semiconductor device are restricted to 58 to 80% by weight of zinc oxide (ZnO), 14 to 30% by weight of boron oxide ($B_2O_3$), 5 to 15% by weight of silicon oxide ($SiO_2$), and less than 10% by weight of rest components in view of the melting temperatures and the thermal expansion coefficients of the composition components. Hereinafter, the composition will be given in term of the percent by weight so far as it is not otherwise specified. 67 to 75% of ZnO, 15 to 22% of $B_2O_3$, and 7.5 to 13% of $SiO_2$ are a preferred range of the composition according to the invention. In this conjunction, the thermal expansion coefficient should be in the range of $41 \times 10^{-7}$ to $55 \times 10^{-7}/°$ C at the temperature of 25 to 300° C and preferably of $41 \times 10^{-7}$ to $44 \times 10^{-7}/°$ C.

SUMMARY OF THE INVENTION

An object of the invention is to provide an improved method of producing thin film of a zinc borosilicate glass through a chemical vapor deposition process.

Another object of the invention is to provide a method of producing a thin film of a zinc borosilicate glass through a chemical vapor deposition process which method allows the thin film having a uniform thickness and a homogeneous chemical composition to be formed over a wide area.

Further object of the invention is to provide a method of forming a glass thin film which is advantageously suited to be used for the passivation of semiconductor device insulation of integrated circuits, fabrication of thin film glass capacitors, etc.

To achieve the above-mentioned objects, according to the present invention, there is provided a method of producing a zinc borosilicate glass through a chemical vapor deposition process, wherein organic compounds of zinc, boron and silicon are subjected to reaction in an oxidizing atmosphere, thereby to deposit the zinc borosilicate glass on a substrate.

The foregoing objects and other objects as well as the characteristic features of the invention will become more apparent and more readily understandable by the following description and the appended claims when read in conjunction with the accompanying drawings.

BRIEF DESCRIPTION OF THE DRAWINGS

FIGS. 3a, 3b and 3c show configurations of reactors and nozzles wherein FIG. 3a shows a structure suited for performing the method according to the invention, while FIGS. 3b to 3c show structures for comparison.

FIGS. 4 and 5 show distributions of zinc oxide in the deposited glasses.

DETAILED DESCRIPTION OF THE INVENTION

Figure 1:
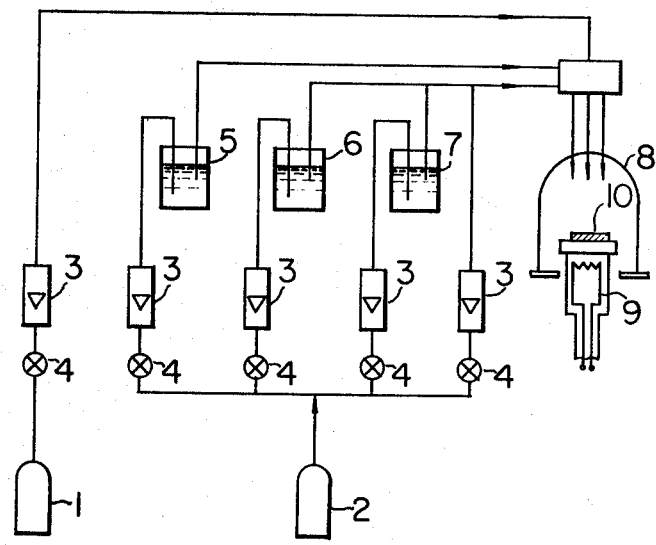
FIG. 1 shows an example of an apparatus used for forming a glass according to the invention.

To realize the present invention, a starting material including alkyl and alkoxy compounds of boron is mixed with another liquid raw material containing other required component, at a room temperature, and the resulted mixture is subjected to reaction at the temperature of 300° to 700° C in the atmosphere containing oxygen thereby to form the zinc borosilicate glass. According to a unique aspect of the present invention, organic compounds such as trimethyl boron $B(CH_3)_3$, triethyl boron $B(C_2H_5)_3$ and triethoxy boron $B(OC_2H_5)_3$ are employed for the raw material of boron, while saturated or non-saturated zinc alkyl compounds in liquid phase at a room temperature are used as the raw material of zinc, and alkyl compounds in liquid phase at a room temperature such as those expressed by $Si(C_nH_{2n+1})_4$ and tetraethoxy silane $Si(OC_2H_5)_4$ are used as the raw material for silicon. These raw materials are made to react with oxygen at a place at which the glass is to be formed through the chemical vapor deposition. It is important that the alkyl compound of zinc be separated so that it may not contact with oxygen and other raw materials in the pass from raw material evaporator to the reaction place.

When hydride is employed as a component of the starting material, it has been found that water is produced in a quantity corresponding to that of hydrogen contained in the starting material under the glass forming conditions and produced water vapor will vehemently react with the raw material of zinc to produce zinc oxide which does not only take a part in the formation of glass, but will result in insufficiency of the amount of zinc, since zinc oxide as produced is in a solid phase at the room temperature as well as the reaction temperature and will adhere to the nozzle portion of the supply conduit. If the quantity of zinc contained in the raw material is increased so as to compensate for the insufficiency thereof the hydride component will in turn become insufficient for obtaining the desired glass composition. According to the method of the invention, however, the amount of water as produced in the vitrification reaction can be suppressed to such a degree which is practically ineffective for the reaction, whereby the hydrolysis reaction of the raw material for zinc can be reduced to a negligible degree and a stabilized vitrification reaction can be maintained, since organic materials such as triethyl boron, tripropyl boron or triethoxy boron for the raw material of boron and tetraethoxy silane or tetraethyl silane for the raw material of silicon are employed. When dibutyl zinc is used as the raw material for zinc, the reaction temperature will become higher than 500° C. However, it has been found that the organic compounds of boron such as described above can maintain a stabilized reactivity even at such a high temperature. Boron hydride will cause an explosive reaction, when it contacts with oxygen at a high concentration. However, there is no danger of such explosive reaction in the case of alkyl compounds even at a high concentration. Thus, the reaction rate can be increased by using a correspondingly increased concentration of the raw material.

As the raw material for zinc, divinyl zinc $Zn(C_2H_3)_2$, diethyl-, dipropyl- and dibutyl-zinc are preferred. Diethyl zinc is vitrified at the temperature of 300° to 420° C. In case of dibutyl zinc, vitrification will take place at the temperature of 450° to 700° C and in particular 500° to 600° C. The reaction temperature of dipropyl zinc lies in the intermediate range. The zinc borosilicate glass will begin to be crystallized at the temperature higher than about 650° C and internal stress will concurrently decrease. However, it has also been found that the glass film having any wanted thickness can be continuously produced with the internal stress suppressed to a minimum value when the glass deposition reaction is carried out at a temperature higher than 500° C. When the thickness of glass film becomes greater than 4 to 5 $\mu$m, cracks will be usually produced in the glass film due to the internal stress overcoming the inherent mechanical strength of the glass film, although the occurrence of such undesirable phenomenon depends on the difference in the thermal expansion coefficient between the substrate and the deposited glass film. In the case the reaction temperature is lower than 500° C, it will be necessary to raise the temperature to a crystallizing point every time when the thickness of the deposited glass film attains a value of 4 to 5 $\mu$m, thereby to clear the internal stress. Thermal treatment should be carried out at a temperature higher than 600° C.

The substrate to be deposited with the glass film is disposed in a reactor after the surfaces thereof having been cleaned and is heated to a predetermined temperature in the atmosphere of an inert gas. For the introduction of the raw materials into the reactor, an inert gas such as argon and nitrogen is used as the carrier gas. For controlling the supply flow, the temperature of a mixer or bubbler for mixing the carrier gas with the raw materials as well as the quantity of the carrier gas are regulated.

For supplying the raw material vapor into the reactor, it is necessary that at least the raw material vapor for zinc be supplied through a feeding path separated independently from oxygen. It is further noted that when ethoxy compound is employed for the raw material of boron, the ethoxy compound will make the following reaction with the zinc compound to produce a diethoxy zinc compound in a solid which exerts an adverse influence to the vitrification reaction. That is,

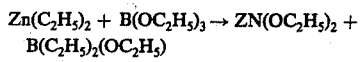

Accordingly, in order to form a glass film having a uniform thickness and a homogeneous composition over a wide area, some provision has to be made in the configuration of the injecting nozzle of the raw material supply conduits extending to the reaction chamber. When the quantity of zinc or (and) boron is small in the glass composition of the two-component glass series or the three-component-glass series according to the invention, any suitable structure of the nozzle can be employed. However, in carrying out the method according to the invention, it is preferred that the nozzle is opened in the direction substantially in parallel with the surface of the substrate on which the glass film is to be deposited and the vertical distance or height between the center axis of the nozzle and the surface of the substrate is selected in the range of 5 to 40 mm. If the distance is smaller than 5 mm, the uniformity of the thickness will be degraded. On the other hand, when the distance is greater than 40 mm, the growth or deposition rate of the glass film will become lowered. In the case the vertical distance is greater than 25 mm, the orientation of the injecting orifice of the nozzle should preferably be slightly inclined downwardly so as to increase the deposition rate. It is, however, to be noted that a large inclination of the nozzle orifice will result in the degraded homogeneity of the glass composition.

With a view to further improve the uniformity of the glass film, it is preferred to impart a rotational or reciprocating movement to the nozzle or substrate.

When the deposited glass thin film is crystallized at a high temperature, the thermal expansion coefficient thereof will undergo variations. Accordingly, thermal treatment of the deposited glass film at a temperature higher than 650° C should be carried out, as occasions require. In the heat treatment, the temperature may be raised rapidly up to 550° C without incurring the danger of cracks being produced. However, in the temperature range exceeding this point, the increasing rate of the temperature should be selected slow as in the order of less than 5° C/min.

The composition of the produced glass comprises 58 to 80% by weight of zinc oxide, 14 to 30% by weight of boron oxide, 5 to 15% by weight of silicon oxide and a trace of other added components. The thermal coefficient of the glass is in the range of $41 \times 10^{-7}$ to $55 \times 10^{-7}/°$ C as averaged over the temperature range of 25° to 300° C. In order to attain the thermal expansion coefficient of $41 \times 10^{-7}$ to $44 \times 10^{-7}/°$ C, the composition of the glass will be of 67 to 75% by weight of zinc oxide, 15 to 22% by weight of boron oxide and 7.5 to 13% by weight of silicon oxide.

The invention is further illustrated by the following examples:

EXAMPLE I

By employing an apparatus schematically shown in FIG. 1, a glass thin film was formed on a silicon wafer constituting a substrate from dimethyl zinc as a raw or starting material for zinc, tetraethoxy silicon as a starting material for silicon and triethoxy boron as a starting material for boron. As the carrier gas for these starting materials, nitrogen gas was used. In the apparatus of FIG. 1, reference numeral 1 denotes an oxygen source, 2 a carrier gas source, 3 a flow meter, 4 a valve, 5, 6 and 7 bubblers for receiving raw materials, 8 a reactor, 9 a heater and 10 a substrate.

The composition of the glass was regulated by controlling the flow rate of carrier gas as well as the temperature of bubblers. Oxygen was supplied in excess of 10 to 15% over theoretical amount required for converting zinc, boron and silicon contained in the respective raw materials into oxides in forms of ZnO, $B_2O_3$ and $SiO_2$, respectively.

The temperature of the substrate was maintained at 300° to 700° C. Deposition was continued for 1 hour.

The produced deposit was examined as to whether it was vitrified through an infrared spectrum absorption test. The homogeneity of the composition was determined by an X-ray micro-analyzer which was scanning on the deposited glass film and determined the intensity ratios of zinc to silicon and boron to silicon. Results are shown in Table I.

TABLE I

| Example No. | Composition (weight %) | | | Homogeneity of Glass Constituents | | | | |
|---|---|---|---|---|---|---|---|---|
| | ZnO | B$_2$O$_3$ | SiO$_2$ | 300° C | 400° C | 500° C | 600° C | 700° C |
| Example 1 | 59 | 30 | 11 | C | B | A | A | B |
| Example 2 | 65 | 25 | 10 | C | A | A | A | B |
| Example 3 | 69 | 19 | 12 | C | A | A | A | B |
| Example 4 | 73 | 19 | 8 | C | A | A | A | C |
| Reference Ex. 1 | 51 | 39 | 10 | C | B | A | A | B |
| Reference Ex. 2 | 88 | 2 | 10 | C | B | A | B | C |
| Reference Ex. 3 | 81 | 5 | 14 | C | C | C | C | C |

In the Table I, homogeneity grade "A" means that the variation ratios of the components or constituents remain within ± 3%, "B" means the variation ratios within ± 5% and "C" represents the variation ratios greater than 5%. The analysis of the glass components was performed with the aid of an ion microanalyzer.

In the desired range of glass compositions of 58 to 80% of ZnO, 14 to 30% of B$_2$O$_3$ and 5 to 15% of SiO$_2$, an extremely improved homogeneity of the constituents could be accomplished in the glass thin film produced at the reaction temperature in the range of 400° to 650° C. In the reference examples 1 and 2 (Reference Ex. 1 and 2 in Table I) in which a decreased and an increased content of zinc were employed, respectively, the formed glass film exhibited a good homogeneity grade compatible with those of the glass compositions according to the invention. However, the thermal expansion coefficients of the glasses in the case of the reference examples 1 and 2 was increased, resulting in partial cracks produced in the glass film. In the case of the reference or comparison example 3, tetraethoxy silane for the starting material of silicon was replaced by mono-silane (SiH$_4$). It can be seen that the homogeneity of the glass composition is remarkably degraded, when hydride is employed as the raw material. This is because boron oxide is difficult to be diffused into glass.

EXAMPLE II

In this Example relation between the quantity of supplied oxygen and the glass deposition was measured by comparing the cases in which an ethyl compound and an ethoxy compound were selectively employed for the starting materials of boron and silicon, with dipropyl zinc Zn(C$_3$H$_7$)$_2$ used as the starting material for zinc in both cases. The quantity of the supplied oxygen was represented by mol-ratio relative to the theoretical oxygen requirement, which means the quantity of oxygen required for the formation only of metal oxide. For example, for 1 mol of B(C$_2$H$_5$)$_3$, the theoretical oxygen requirement is 3/2 mols, while for 1 mol of B(OC$_2$H$_5$)$_3$ it is −3/2 mols.

In the experimental example numbered 5, Zn(C$_3$H$_7$)$_2$, B(C$_2$H$_5$)$_3$ and Si(c$_2$H$_5$)$_4$ were employed as raw materials. In the example 6, Zn(C$_3$H$_7$)$_2$, B(OC$_2$H$_5$)$_3$ and Si(OC$_2$H$_5$)$_4$ were used as the raw materials, while Zn(C$_3$H$_7$)$_2$, B$_2$H$_6$ and Si(OC$_2$H$_5$)$_4$ were used in the reference example 4. The intended glass composition was selected as 70% of ZnO, 20% of B$_2$O$_3$ and 10% of SiO$_2$. The raw or starting material gases were fed to the reactor with predetermined quantity ratios corresponding to the desired composition. The reaction was made at the temperature of 550° C.

Figure 2:
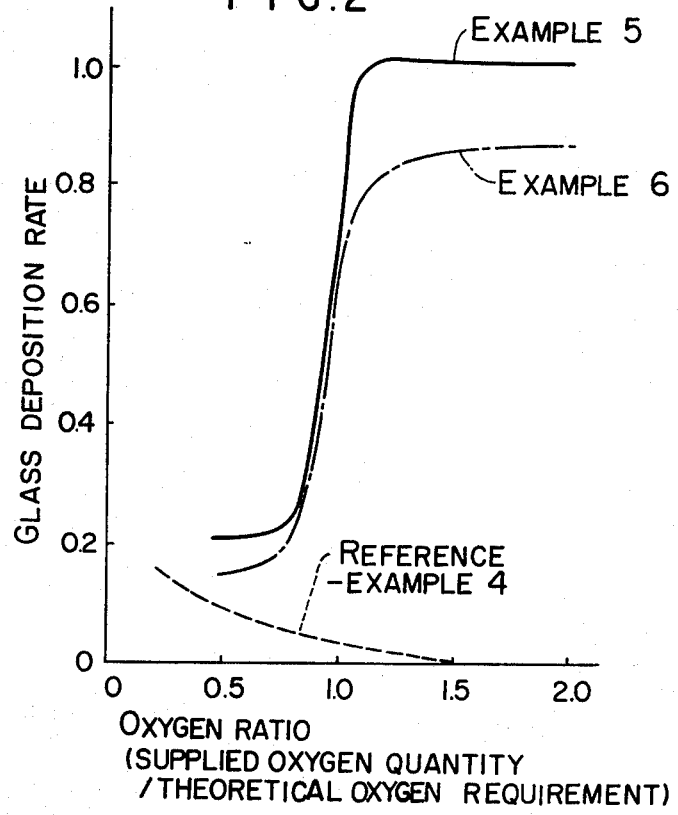
FIG. 2 is a graph to illustrate the relationship between the glass deposition rate and the oxygen ratio which represents the ratio of supplied oxygen quantity to the theoretical oxygen requirement.

Results are shown in FIG. 2.

It has been found that the desired composition can be obtained by supplying the theoretical oxygen requirement. The fact that the glass deposition was decreased in the case where the ethoxy compound was used as the raw material as compared with the case where the alkyl compound was used may be explained by that ethoxy zinc would possibly be produced due to the auxiliary reaction. The quantity of supplied oxygen will be sufficient if it is in excess of about 15% over the theoretical requirement thereof. In the reference or comparison example 4 in which diborane (B$_2$H$_6$) was used as the raw material, the yield of the glass having the intended composition was low and the effect of the oxygen supplying ratio could not be determined.

EXAMPLE III

Figure 3A:
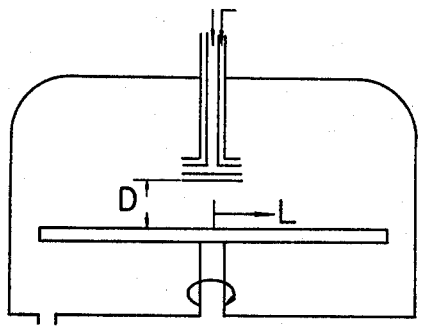

In this Example, relation between the homogeneity of the glass composition and configurations of injecting nozzles was examined. A glass thin film was formed from raw materials of dibutyl zinc, triethyl boron and tetraethyl silane with a supply of oxygen in the quantity ratio of 115% of the theoretical requirement thereof. The reaction was made at the temperature of 600° C. The configurations on structures of the nozzles and the reactor are shown in FIG. 3a. As can be seen from the figure, the raw material gases were injected or blown in the direction in parallel with the surface of the substrate. By varying the distance D between the nozzles and the surface of the substrate, distribution of the glass composition of the film deposited in the direction L was detected.

Figure 3B:
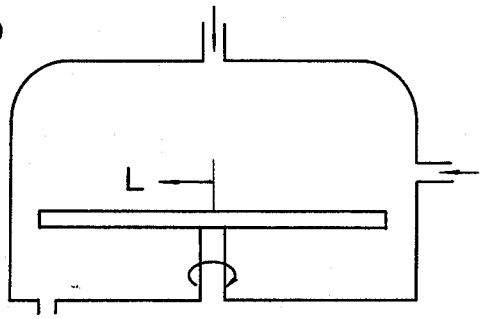
Figure 3C:
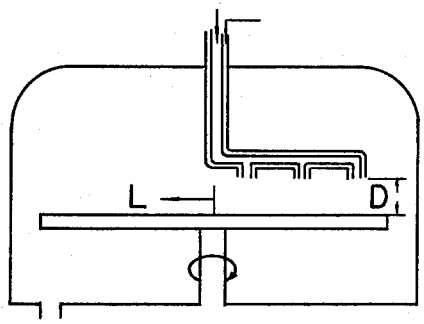

For the purpose of comparison, structures shown in FIGS. 3b and 3c were employed. In the apparatus shown in FIG. 3b, the raw material gases were supplied from the top and the lateral side of the reactor container. The distribution of the deposited glass composition was meaured along the direction indicated by L. In the case of the structure shown in FIG. 3c, the nozzles of dual conduits were so oriented that the raw material gases were injected in the vertical direction relative to the substrate surface.

In FIG. 4, results of measured distribution of zinc oxide are shown, which measurement was effected by varying the vertical distance D (mm) between the substrate and the nozzles in the apparatus shown in FIG. 3a. When the distance D is in the range of 5 to 50 mm, it has been found that a glass thin film having a homogeneous composition along the length greater than 40 mm in the direction L can be obtained.

On the contrary, when the reactor of the structure shown in FIG. 3b was used, nonhomogenity in the distribution of the constituent composition was significant, as indicated by the curve b in FIG. 5.

In the case of the reactor shown in FIG. 3c, the glass film was formed with the distance D of 20 mm, and the distribution curve such as c shown in FIG. 5 could be obtained. It will be understood that the glass film having a homogeneous or uniform composition and a desired size can not be produced in the structures of the apparatus shown in FIG. 3b and c for comparison.

EXAMPLE IV

A glass thin film was formed on the surface of a planar type silicon diode including $n^+$ and $p^+$ layers in the n-type silicon substrate. The diode is rated for 1A and designed to have a backward breakdown voltage of 600 V.

Figure 6:
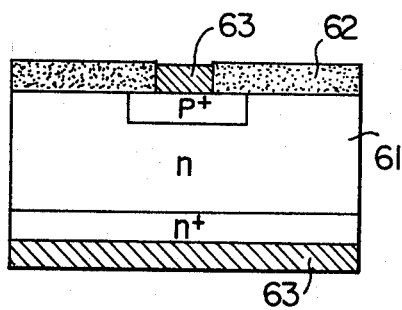
FIG. 6 is a sectional view of a planar type diode to which the invention is applied.

FIG. 6 shows a sectional view of the abovementioned diode. The substrate 61 comprises $p^+$, n, $n^+$ layers and a glass film 62 having a thickness of 2 μm is formed as extending from the exposed surface portion of the $p^+$-n junction to the periphery of the diode. Electrode 63 at the $p^+$ side is provided in an opening formed in the glass film through a chemical etching utilizing a photo-resist film. The conditions under which the glass thin film 62 has been formed are enumerated in Table II.

TABLE II

| Raw materials | Ratios of supplied raw materials | | | Temperature of substrate (° C) | Chemical vapor deposition duration (min) |
|---|---|---|---|---|---|
| | Temperature of bubblers (° C) | Flow rate of carrier gas (l/min) | Flow rate of $O_2$ (l/min) | | |
| $Zn(C_2H_5)_2$ | 0 | 0.1 | | | |
| $Si(OC_2H_5)_4$ | 23 | 1.0 | 0.2 | 500 | 15 |
| $B(OC_2H_5)_3$ | 23 | 0.9 | | | |

The glass film produced through the chemical vapor deposition was heated to the temperature of 670° C at the raising rate of 2°/min and left at this temperature for 40 min and finally cooled down from 670° to 550° C at the cooling rate of 2° C/min.

Figure 7:
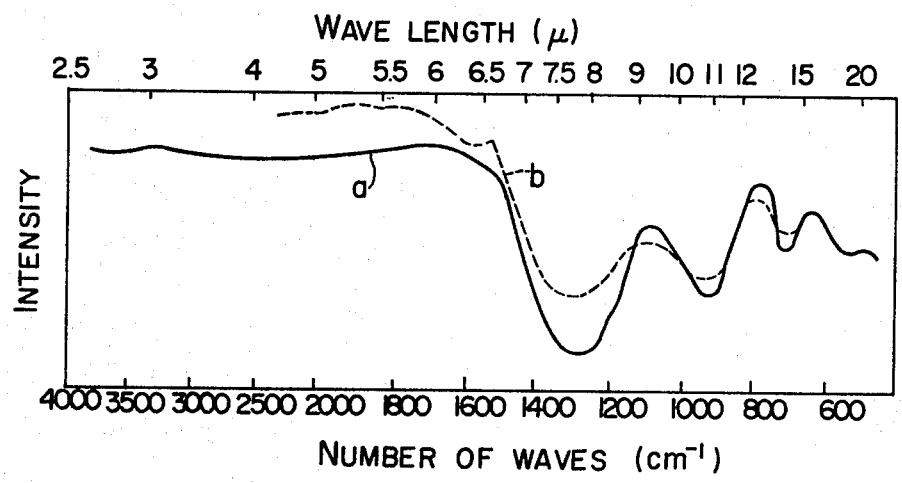
FIG. 7 show graphically infrared absorption characteristics of a glass prepared according to the method of the invention and that of a glass produced according to a conventional fusing method.

The infrared spectrum absorption characteristic of the produced glass film is shown in FIG. 7, in which the curve a represents the characteristic of the glass film formed according to the invention, while the curve b shows the characteristic of a glass having the same composition and formed in accordance with a conventional fusing method. It will be noted that both the curves a and b have the substantially identical profiles.

Figure 8:
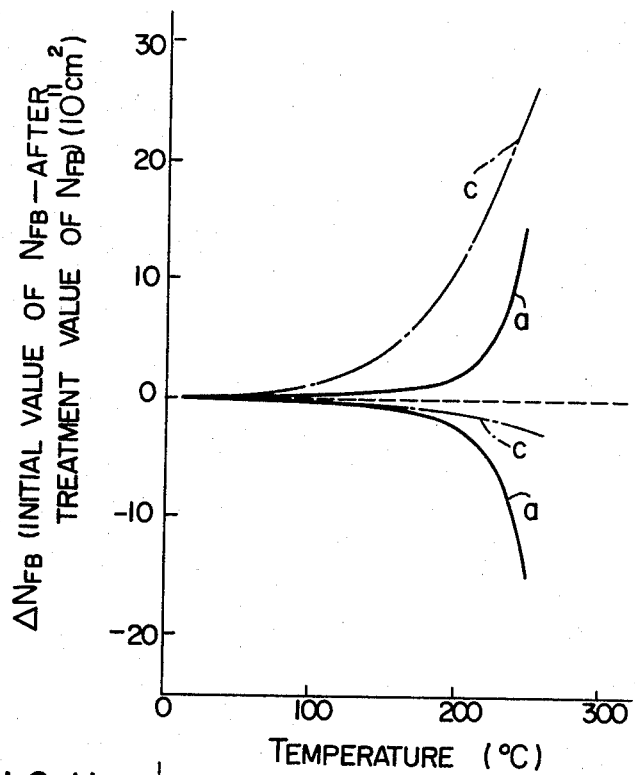
FIG. 8 graphically shows relationships between the density change of surface charge in a passivation film for a planar type diode and the temperature.

FIG. 8 shows density change of surface charge when the metal-glass-silicon diode is subjected to a bias-temperature treatment in which a voltage is applied with temperature being varied. In FIG. 8, curve a represents the data obtained in the diode having the glass film formed through the chemical vapor deposition method according to the invention. The curve b comparatively represents those of a diode having a $SiO_2$-film produced through a thermal oxidation process in place of the glass film. It can be seen that in the case of the diode having the glass film formed according to the invention, substantially same surface charge density changes will occur in response to both the positive and the negative applied voltages and this characteristic is stabilized up to a temperature of 200° C.

Figure 9:
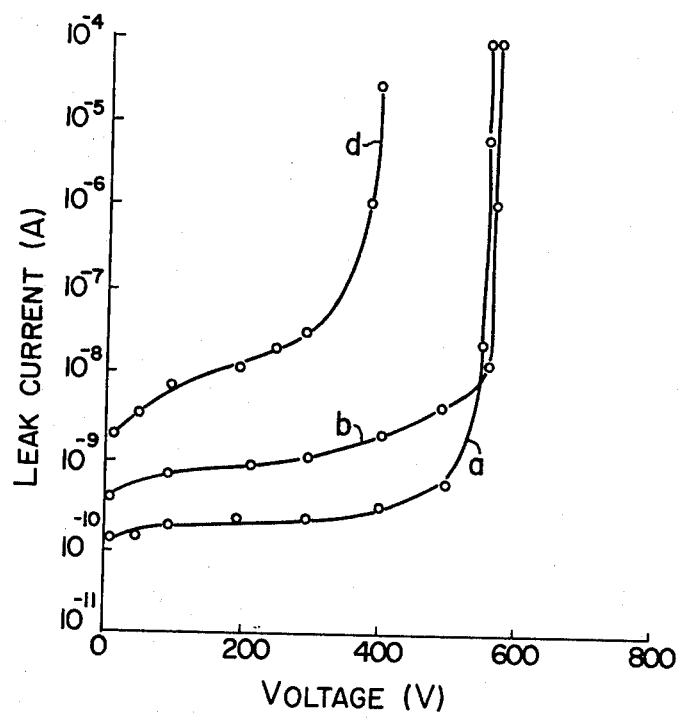
FIG. 9 graphically illustrates leak current characteristics.

Relations between the applied voltage and the leaking current are shown in FIG. 9. Curve a represents the relation in the planer diode according to the invention. At the film thickness of 2 μm, backward breakdown voltage was about 550 V. The curve b comparatively shows the voltage-leak current characteristic of a diode having a passivation glass film of 30 μm thick which has been formed by firing the glass particles deposited through electrophoresis. The infrared absorption characteristic of this glass film is shown by the curve b in FIG. 7. The comparison example as represented by the curve d was composed of a phosphorous glass film superposed on the silicon dioxide film which have been formed through thermal oxidation. It will be noted that the backward breakdown voltage is decreased to 400 V in the comparison example.

EXAMPLE V

Figure 10:
FIG. 10 is a sectional view of a thin film capacitor to which the present invention is applied, FIG. 11 graphically shows static capacitance change rates of glass capacitors shown in FIG. 10 relative to frequency change.

In this Example, the invention was applied to a thin film capacitor. FIG. 10 shows a cross sectional view of a fabricated capacitor. A lower electrode 12 of Al—Ni—Ag alloy is evaporated on an alumina ceramic plate 11. A glass film 13 of zinc borosilicate glass having a thickness of 3 μm is formed on the electrode 12 through the chemical vapor deposition process. An upper electrode 12' is formed on the zinc borosilicate glas film 13 of 3 μm thickness, which has been formed under the conditions listed in the Table III.

TABLE III

| Raw materials | Ratios of supplied raw materials | | Temperature of substrate (° C) | Chemical vapor deposition duration (min) |
|---|---|---|---|---|
| | Temperature of evaporator (° C) | Flow of carrier gas (l/min) | | |
| $Zn(C_4H_9)_2$ | 0 | 0.1 | | |
| $Si(OC_2H_5)_4$ | 23 | 1.0 | | |
| $B(OC_2H_5)_8$ | 23 | 0.9 | 600 | 20 |
| $O_2$ | 23 | 0.2 | | |

Table IV shows various characteristics of the glass film produced under the above conditions. The thickness of the glass film is about 3 μm. For comparison, the corresponding characteristics of a glass film in thickness of about 45 μm which has been formed of Dupon's glass paste #9101 for a multi-layer wiring through a printing process.

TABLE IV

| Glass Film Forming Process | No. | Thickness (μm) | Dielectric constant | Tan δ (%) | Insulation Resistance (Ω) | Breakdown Voltage (V) | Temperature characteristics of Dielectric constant (ppm/° C) | |
|---|---|---|---|---|---|---|---|---|
| | | | | | | | 20–85° C | −25–20° C |
| Chemical Vapor Deposition Process | 1 | 3.1 | 12.0 | 0.11 | $0.68 \times 10^{12}$ | 820 | −38 | +42 |
| | 2 | 3.0 | 11.8 | 0.15 | 0.42 " | 900 | −26 | +36 |
| | 3 | 3.0 | 12.4 | 0.12 | 0.52 " | 870 | −19 | +30 |
| | 4 | 2.9 | 12.1 | 0.13 | 0.65 " | 910 | −30 | +34 |
| | 5 | 3.1 | 12.1 | 0.14 | 0.39 " | 880 | −26 | +40 |
| | 6 | 3.0 | 12.0 | 0.11 | 0.70 " | 900 | −32 | +34 |
| | 7 | 3.1 | 12.2 | 0.12 | 0.62 " | 890 | −20 | +28 |
| Printing Process of Dupon's paste | 8 | 44.0 | 13.2 | 0.82 | $0.52 \times 10^{12}$ | 680 | +75 | +85 |
| | 9 | 54.2 | 11.3 | 1.01 | 0.29 " | 840 | +85 | +95 |
| | 10 | 38.0 | 14.8 | 0.37 | 0.57 " | 600 | +120 | +98 |

TABLE IV-continued

| Glass Film Forming Process | No. | Thickness (μm) | Dielectric constant | Tan δ (%) | Insulation Resistance (Ω) | Breakdown Voltage (V) | Temperature characteristics of Dielectric constant (ppm/° C) | |
|---|---|---|---|---|---|---|---|---|
| | | | | | | | 20-85° C | −25-20° C |
| #9101 | 11 | 46.0 | 12.8 | 0.72 | 0.48 " | 810 | +85 | +120 |
| | 12 | 41.0 | 12.8 | 2.20 | 0.38 " | 720 | +70 | +90 |

As can be seen from the Table IV, the dielectric constant of the capacitors according to the invention is low in the order of 12 to 16 as in the case of the capacitors formed through the printing method. The value of tan δ of the capacitor having the glass film according to the invention is as low as about 1/10 of that of the glass film formed by the thick film process. The insulation resistance is substantially same in both cases and in the order of $0.39 \times 10^{12}$ to $0.68 \times 10^{12} \Omega$. The breakdown voltage in DC is about 820 to 910 V as high as that of the capacitor fabricated through the thick film process, nevertheless of the thickness of the glass film according to the invention is as small as about 1/12 of that of the latter. The temperature variation characteristic of the dielectric constant is retained lower than ±50 ppm/° C with a reduced difference in the variations of the temperature characteristic among the individual capacitors.

Figure 11:
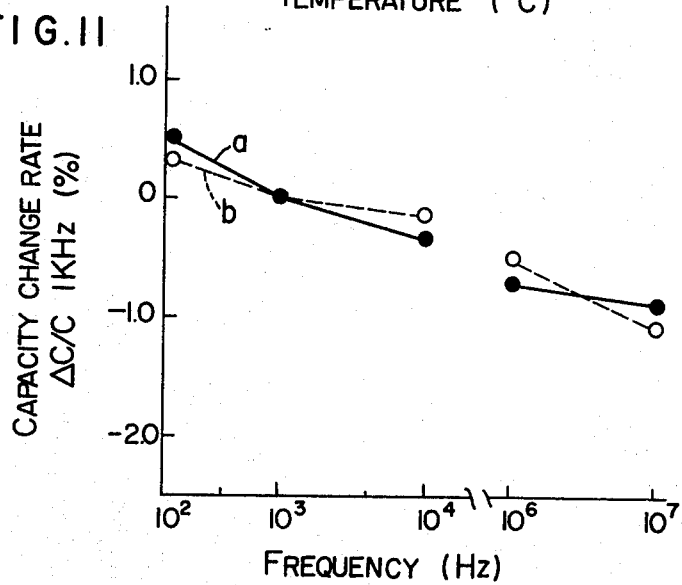

FIG. 11 shows relations between the frequency and the static capacitance of the glass film. In the figure, curve a corresponds to the glass film formed according to the invention, while the curve b represents data obtained from the glass film of 44 μm thick formed through the thick film process. The variation in the static capacitance of the glass film according to the invention is very small in the order of + 0.5 to − 1.0% in the frequency range of $10^2$ to $10^7$ Hz, which is substantially the same as that of the glass film formed through the thick film process.

As hereinbefore described, the glass film produced according to the invention is evaded from the inclusion of voids and has a high breakdown voltage notwithstanding of the extremely reduced thickness in the order of about 1/12 of that of the glass film formed according to the conventional thick film process. Furthermore, the dielectric constant can be made low with little variation thereof under the influence of the applied frequencies.

One of the features which is required in an insulation film for a multi-layer wiring resides in that the variation in the static capacitance due to the frequencies of the applied electric signal can be suppressed to a minimum value. In this point of view the glass film according to the invention can be effectively used as the insulation film for the multi-layer wiring.

We claim:

1. A method of producing a zinc borosilicate glass through chemical vapor deposition comprising allowing dinenyl an alkyl or alkenyl compound of zinc in liquid phase at room temperature, at least one organic compound of boron selected from the group consisting of alkyl and alkoxyl compounds of boron and at least one compound of silicon selected from the group consisting of alkyl and alkoxyl compounds of silicon in liquid phase at room temperature to react in an oxidizing at at a temperature of 300° to 700° C in the presence of a substrate, thereby depositing a zinc borosilicate glass on the substrate.

2. A method as set forth in claim 1, wherein said alkyl compound of zinc is selected from the group consisting of diethyl zinc, dipropyl zinc and dibutyl zinc, said organic compound of boron is selected from the group consisting of trimethyl boron, triethyl boron and triethoxy boron, and said organic compound of silicon is selected from the group consisting of tetraethyl silicon and tetraethoxy silicon.

3. A method as set forth in claim 1, wherein the reaction is carried out at a temperature in the range of 400° to 650° C.

4. A method as set forth in claim 1, wherein the zinc borosilicate glass has an averaged thermal expansion coefficient in the range of $41 \times 10^{-7}/°$ C to $55 \times 10^{-7}/°$ C at a temperature in the range of 25° to 300° C.

5. A method as set forth in claim 1, wherein the zinc borosilicate glass comprises 58 to 80% by weight of zinc oxide (ZnO), 14 to 30% by weight of boron oxide ($B_2O_3$) and 5 to 15% by weight of silicon oxide ($SiO_2$).

6. A method as set forth in claim 1, wherein the substrate is made of silicon.

7. A method of producing a zinc borosilicate glass through a chemical vapor deposition, wherein an inert carrier gas containing organic compounds vapor of zinc, boron and silicon which are in liquid phase at a room temperature and oxygen gas are blown through a nozzle disposed in the vicinity of a substrate and having an injecting orifice opened so as to blow said gases in a direction in parallel with the substrate which is heated to a reaction temperature and on which said glass is to be formed, thereby depositing the zinc borosilicate glass on the surface of said substrate.

8. A method as set forth in claim 7, wherein the organic compound of zinc is dinenyl zinc or an alkyl compound of zinc, the organic compound of boron is at least one compound selected from an alkyl compound and an alkoxyl compound of boron, and the organic compound of silicon is at least one compound selected from an alkyl compound and an alkoxyl compound of silicon.

9. A method as set forth in claim 7, wherein the oxygen gas is employed in a quantity greater than the theoretical requirement thereof for converting zinc, boron and silicon contained in the respective raw materials into ZnO, $B_2O_3$ and $SiO_2$, respectively.

10. A method as set forth in claim 7, wherein the reaction is conducted at a temperature in the range of 400° to 650° C.

11. A method as set forth in claim 7, wherein the substrate and the nozzle are movable relative to each other.

12. A method as set forth in claim 7, wherein the zinc borosilicate glass has a thermal expansion coefficient in the range of $41 + 10^{-7}/°$ C to $55 \times 10^{-7}/°$ C on an average at a temperature in the range of 25° to 300° C.

13. A method as set forth in claim 7, wherein the zinc borosilicate glass comprises 58 to 80% by weight of zinc oxide, 14 to 30% by weight of boron oxide and 5 to 15% by weight of silicon oxide.

14. A method of producing a zinc borosilicate glass through a chemical vapor deposition, wherein an inert carrier gas containing organic compounds vapor of zinc, boron and silicon in liquid phase at a room temperature and oxygen gas are blown from a nozzle disposed over a movable substrate on which said glass is to be deposited and which is heated to a reaction temperature, said nozzle being positioned with a distance of 5 to 50 mm from said substrate and having an orifice opened so as to blow said gases in a direction parallel with the surface of said substrate, thereby depositing the zinc borosilicate glass on the surface of said substrate which glass is thereafter heated to a temperature higher than 650° C.

* * * * *